US011169947B2

(12) United States Patent
Lin et al.

(10) Patent No.: US 11,169,947 B2
(45) Date of Patent: Nov. 9, 2021

(54) DATA TRANSMISSION SYSTEM CAPABLE OF TRANSMITTING A GREAT AMOUNT OF DATA

(71) Applicant: Realtek Semiconductor Corp., HsinChu (TW)

(72) Inventors: Chen-Tung Lin, HsinChu (TW); Yuefeng Chen, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/953,358

(22) Filed: Nov. 20, 2020

(65) Prior Publication Data

US 2021/0157759 A1    May 27, 2021

(30) Foreign Application Priority Data

Nov. 25, 2019  (CN) .......................... 201911166661.0

(51) Int. Cl.
*G06F 13/40* (2006.01)
*G06F 30/343* (2020.01)
*G06F 13/42* (2006.01)

(52) U.S. Cl.
CPC ...... *G06F 13/4027* (2013.01); *G06F 13/4282* (2013.01); *G06F 30/343* (2020.01); *G06F 2213/0042* (2013.01)

(58) Field of Classification Search
CPC . G06F 13/4027; G06F 13/4282; G06F 30/343
See application file for complete search history.

(56) References Cited

U.S. PATENT DOCUMENTS

| 5,903,744 | A | 5/1999 | Tseng |
| 6,326,806 | B1 | 12/2001 | Fallside |
| 9,239,808 | B2 | 1/2016 | Zhou |
| 9,864,606 | B2 * | 1/2018 | Mimms ............... G06F 15/7871 |
| 9,898,312 | B2 | 2/2018 | Chamberlain |
| 9,928,567 | B2 | 3/2018 | Bittner |
| 10,007,485 | B2 * | 6/2018 | Peters ................... G06F 3/0673 |

(Continued)

OTHER PUBLICATIONS

Texas Instruments TMS320C5515/14/05/04 DSP Universal Serial Bus 2.0 (USB Controller User Guide, Literature No. SPRUGH9A Jun. 2010—Revised May 2014 (Year: 3014).*

*Primary Examiner* — Henry Tsai
*Assistant Examiner* — Christopher A Daley
(74) *Attorney, Agent, or Firm* — Winston Hsu

(57) ABSTRACT

A data transmission system includes a host, a universal serial bus (USB) interface adaptor, a first-in first-out (FIFO) interface adaptor, a plurality of functional circuits, and a bus bridge circuit. The host accesses data according to the communications protocols of USB. The USB interface adaptor accesses data through a first port according to the communications protocols of USB, and accesses data through a second port according to the communications protocols of FIFO. The FIFO interface adaptor accesses data through a third port coupled to the second port according to the communications protocols of FIFO, and accesses data through a fourth port according to the communications protocols of a specific type of bus. The bus bridge circuit transmits the data received from the fourth port to a functional circuit according to the communications protocols of the specific type of bus.

15 Claims, 2 Drawing Sheets

(56) References Cited

U.S. PATENT DOCUMENTS

| | | |
|---|---|---|
| 10,346,181 B2 | 7/2019 | Chamberlain |
| 2006/0149870 A1* | 7/2006 | Sears .................. G06F 13/4027 710/71 |
| 2009/0279559 A1* | 11/2009 | Wong ...................... H04L 49/30 370/412 |
| 2012/0102257 A1* | 4/2012 | Lin ........................ G06F 3/0655 710/315 |
| 2013/0132614 A1* | 5/2013 | Bajpai ................. G06F 13/4286 710/10 |
| 2014/0301207 A1* | 10/2014 | Durand .............. H04L 12/5601 370/235 |

* cited by examiner

US 11,169,947 B2

DATA TRANSMISSION SYSTEM CAPABLE OF TRANSMITTING A GREAT AMOUNT OF DATA

BACKGROUND OF THE INVENTION

1. Field of the Invention

The present invention is related to a data transmission system, and more particularly, to a data transmission system capable of transmitting a great amount of data between a host computer and a field-programmable gate array board.

2. Description of the Prior Art

Since a system on chip (SoC) may include complicate circuits and functions, designers usually use the programmable logic array board (e.g., a field-programmable gate array board) for verification before the chip is officially implemented. For example, the user can program the programmable logic array board into required circuits by a host computer, and send the data to the programmable logic array board for verification. In prior art, communication between the host computer and the programmable logic array board is performed in a serial manner. For example, the universal asynchronous receiver transmitter (UART) interface is often used for data transmission. However, since the bandwidth of serial data transmission is rather small, it will take a long period especially when the transmission data is rather large. In particular, the amount of data to be processed by SoC today is increasing, and the transmission rate of the UART interface is difficult to meet the needs of users.

In addition, in the prior art, Ethernet may be adopted to transmit large data between the host computer and the programmable logic array board. However, Ethernet requires a media access control (MAC) circuit inside the programmable logic array board along with a port physical layer (PHY) added externally for data transmission, thereby making the design and integration of the programmable logic array board complicated.

SUMMARY OF THE INVENTION

One embodiment of the present invention discloses a data transmission system. The data transmission system includes a host, a universal serial bus (USB) interface adaptor, a first-in first-out (FIFO) interface adaptor, a plurality of functional circuits, and a bus bridge circuit.

The host includes a USB port. The host accesses data through the USB port according to communications protocols of USB. The USB interface adaptor includes a first port coupled to the USB port, a second port, and a FIFO storage device. The FIFO storage device stores data received from the first port and the second port. The USB interface adaptor accesses data through the first port according to the communications protocols of USB, and accesses data through the second port according to communications protocols of FIFO.

The FIFO interface adaptor includes a third port coupled to the second port, and a fourth port. The FIFO interface adaptor accesses data through the third port according to the communications protocols of FIFO, and accesses data through the fourth port according to communications protocols of a specific type of bus.

Each of the plurality of functional circuits performs a corresponding function. The bus bridge circuit is coupled to the fourth port and the plurality of functional circuits. The bus bridge circuit transmits data received from the fourth port to a corresponding functional circuit of the plurality of functional circuits and transmits data sent from the corresponding functional circuit to the fourth port.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
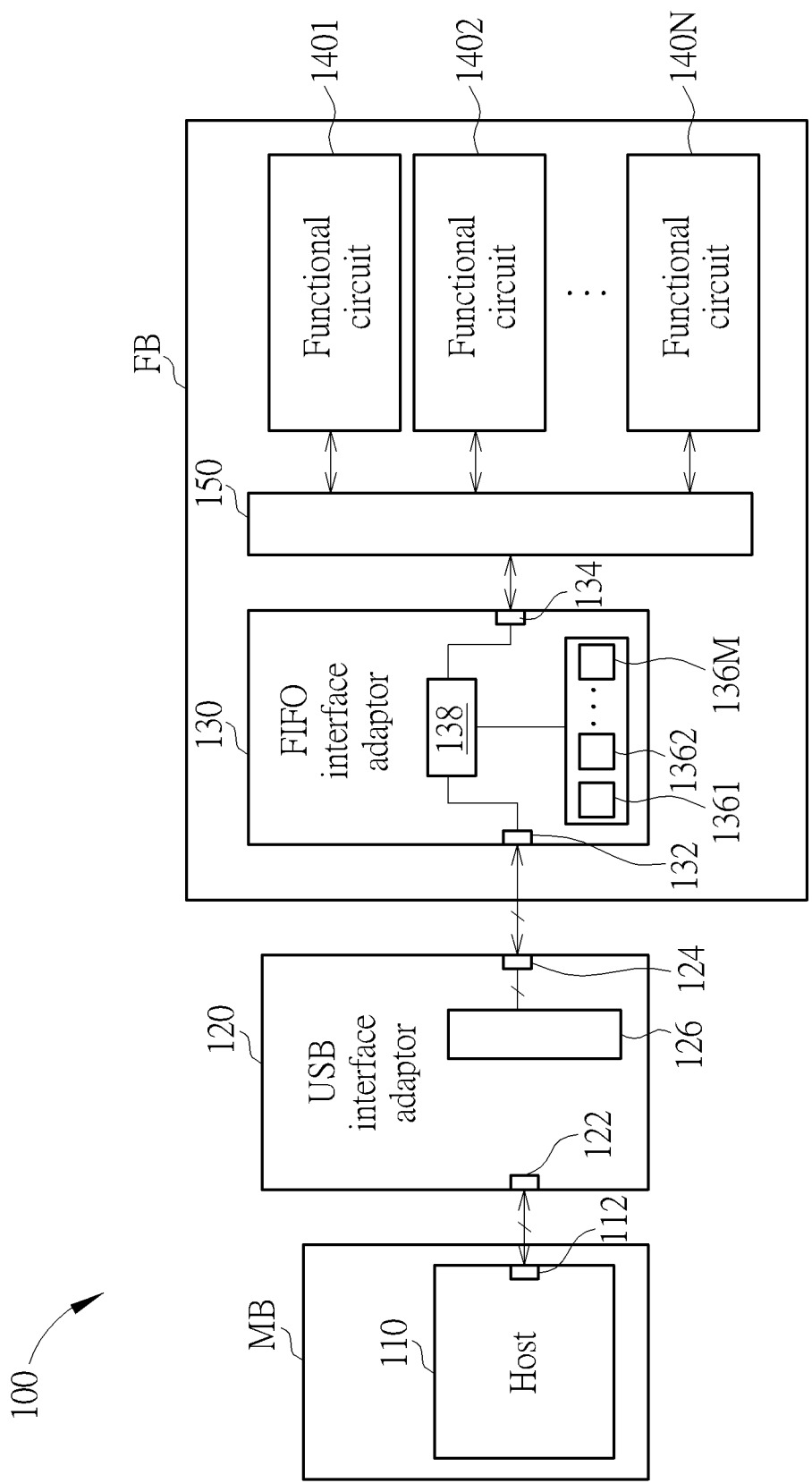
FIG. 1 shows a data transmission system according to one embodiment of the present invention.

FIG. 1 shows a data transmission system 100 according to one embodiment of the present invention. The data transmission system 100 includes a host 110, a USB interface adaptor 120, a FIFO interface adaptor 130, a plurality of functional circuits 1401 to 140N, and a bus bridge circuit 150, where N is an integer greater than 1.

In some embodiments, the host 110 can be a host computer, for example but not limited to, a note book, a desktop, or a mobile device. In FIG. 1, the host 110 can be disposed on a circuit board MB of a computer system. The FIFO interface adaptor 130, the functional circuits 1401 to 140N, and the bus bridge circuit 150 can be disposed on a field-programmable gate array (FPGA) board FB. Furthermore, the USB interface adaptor 120 can be disposed on the FPGA board FB or the connector of the FPGA board FB.

The host 110 can include a USB port 112, and the host 110 can access data through the USB port 112 according to the communications protocols of USB. The USB interface adaptor 120 can include ports 122 and 124, and a FIFO storage device 126. The port 122 can be coupled to the USB port 112. The USB interface adaptor 120 can access data through the port 122 according to the communications protocols of USB and access data through the port 124 according to the communications protocols of FIFO.

That is, the USB interface adaptor 120 can convert data formats for communication between USB and FIFO. For example, the USB interface adaptor 120 can receive data from the port 122 and analyze the data according to the communications protocols of USB. Afterwards, the data can be stored in the FIFO storage device 126, and can be outputted through the port 124 from the FIFO storage device 126 according to the communications protocols of FIFO. Or, the USB interface adaptor 120 can store the data received from the port 124 to the FIFO storage device 126, package the data according to communications protocols of USB, and output the data through the port 122.

The FIFO interface adaptor 130 can include ports 132 and 134. The port 132 can be coupled to the port 124. The FIFO interface adaptor 130 can access data through the port 132 according to the communications protocols of FIFO, and access data through the port 134 according to the communications protocols of a specific type of bus used by the FPGA board FB. That is, the FIFO interface adaptor 130 can convert data formats for communication between FIFO and the bus adopted by the FPGA board FB. In some embodiments, the bus used by the FPGA board FB internally can be, for example but not limited to, a bus defined by advanced microcontroller bus architecture (AMBA) or a bus defined by open core protocol (OCP). The buses defined by advanced microcontroller bus architecture (AMBA) can include the advanced extensible interface (AXI) bus, the advanced peripheral bus (APB), and the advanced high-performance bus (AHB).

The bus bridge circuit 150 can be coupled to the port 134 and the functional circuits 1401 to 140N. In some embodiments, the functional circuit 1401 to 140N can perform their own functions. For example, the functional circuit 1401 can be a memory, the functional circuit 1402 can be a peripheral device, the functional circuit 1403 can be a central processing unit (CPU), the functional circuit 1404 can be a graphic processing unit (GPU), and the functional circuit 140N can be a digital signal processor (DSP). However, in some other embodiments, the functional circuits 1401 to 140N can be used to perform other types of functions.

The bus bridge circuit 150 can transmit data received from the port 134 to a corresponding functional circuit of the functional circuits 1401 to 140N according to the communication protocols of the specific type of bus, and can transmit the data sent from the corresponding functional circuit to the port 134 so the FIFO interface adaptor 130 and the USB interface adaptor 120 can further transmit the data to the host 110.

That is, the host 110 can access data through the USB port 112, and the USB interface adaptor 120 can convert data of USB format into data of FIFO format and transmit the converted data to the FIFO interface adaptor 130. The FIFO interface adaptor 130 can convert the data of FIFO format into data of the format of the specific type of bus used by the FPGA board FB. Consequently, the data transmission between the host 110 and the functional circuits 1401 to 140N on the FPGA board FB can be performed with a higher bandwidth without using Ethernet or complicated drivers and hardware components.

In some embodiments, in order to allow the USB interface adaptor 120 and the FIFO interface adaptor 130 to obtain different formats of data and convert data into different formats, the data transmission system 100 may demand the host 110 to transmit data in packages of a fixed format. For example, a data package transmitted by the host 110 through the USB port 112 can include an instruction column, an address column, a data column, and a data length column.

The instruction column can record the instruction issued by the host 110, for example, the instruction can be a write instruction or a read instruction. The address column can record an address corresponding to the instruction, for example, the write address or the read address. The data column can record at least one piece of data corresponding to the instruction, such as the data to be written. However, during the read operation, since the host 110 should be receiving data, the data column can be blank or omitted. The data length column can record the data length of the at least one piece of data, that is, the length of the write data or the read data, for the burst write or the burst read operation. In addition, a check column may also be included in the data package for recording the check code, such as a check sum or a cyclic redundancy check (CRC), for verifying the correctness of the data transmission. However, in some embodiments, if the verification is not required, then the check column can be omitted.

In some embodiments, the instruction column of the data package can have the same bit width as the FIFO storage 126 so the USB interface adaptor 120 can push the instruction recorded in the instruction column into the FIFO storage device 120 directly after analyzing the data package. For example, if the bit width of the FIFO storage device 126 is 8 bits, meaning that the FIFO storage device 126 can transmit 8 bits of data in parallel, then the data transmission system 100 can also define the instruction column to have an 8-bit width, thereby simplifying the transmission between the USB interface adaptor 120 and the FIFO interface adaptor 130.

Figure 2:
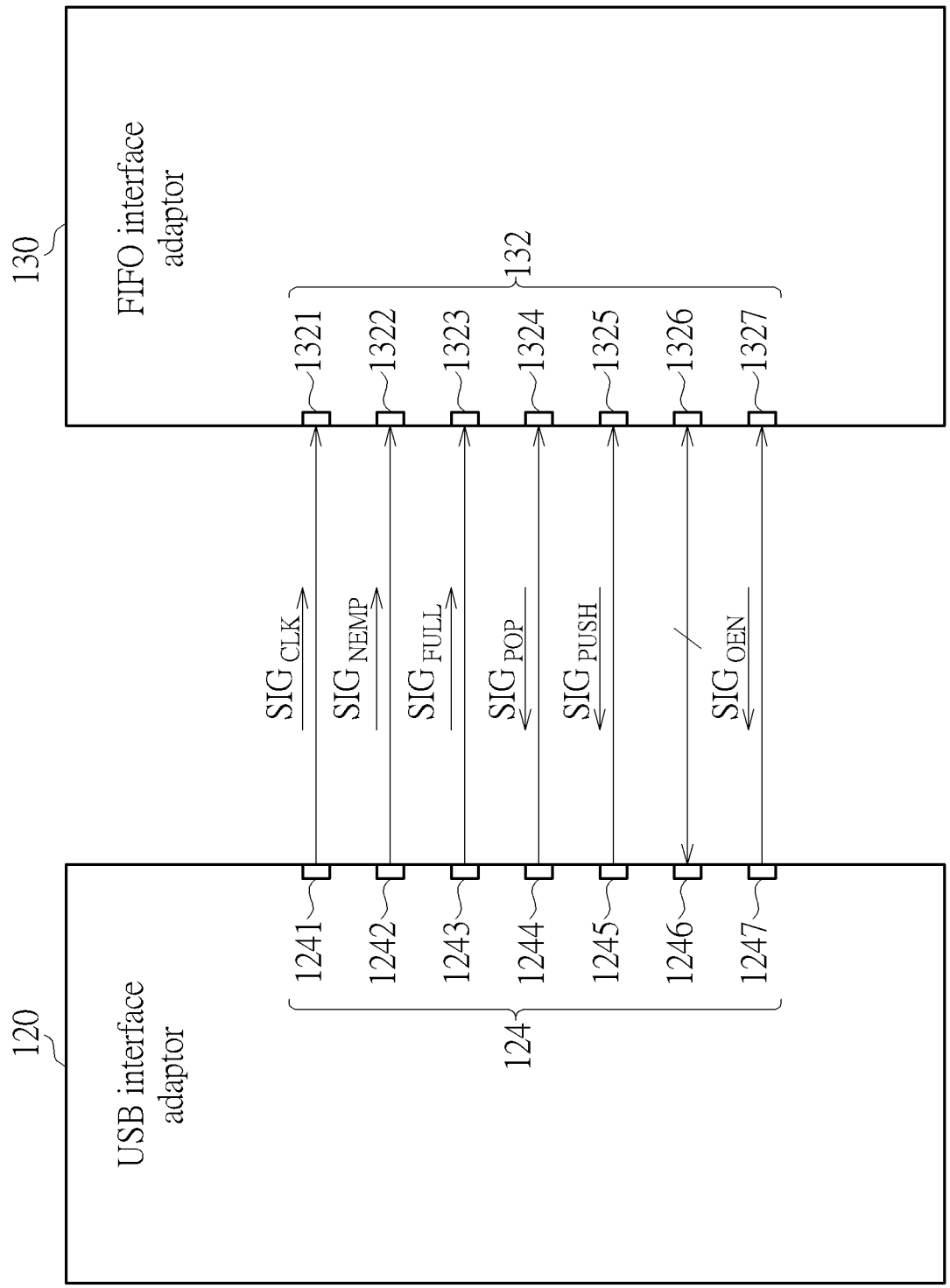
FIG. 2 shows the pins of the USB interface adaptor and the FIFO interface adaptor of the data transmission system in FIG. 1.

FIG. 2 shows the pins of the USB interface adaptor 120 and the FIFO interface adaptor 130. In FIG. 2, the port 124 of the USB interface adaptor 120 can include a clock pin 1241, a non-empty pin 1242, a full pin 1243, a pop pin 1244, a push pin 1245, a plurality of data pins 1246, and an output enable pin 1247. Also, the port 132 of the FIFO interface adaptor 130 can include a clock pin 1321, a non-empty pin 1322, a full pin 1323, a pop pin 1324, a push pin 1325, a plurality of data pins 1326, and an enable pin 1327.

In some embodiments, the clock pin 1321 can receive the clock signal $SIG_{CLK}$ from the clock pin 1241 for identifying the data transmitted between the data pins 1246 and 1326. The non-empty pin 1322 can receive the non-empty signal $SIG_{NEMP}$ from the non-empty pin 1242 to know whether the FIFO storage device 126 has already stored some data or not. The pop pin 1324 and the push pin 1325 can output a pop signal $SIG_{POP}$ and the push signal $SIG_{PUSH}$ respectively to control the FIFO storage device 126. Since the data pins 1246 and 1326 can be bidirectional transmission pins, the output enable pin 1327 can be used to send an output enable signal $SIG_{OEN}$ to indicate the transmission direction. However, the ports 124 and 132 are not limited by the pins shown in FIG. 2. In some other embodiments, the ports 124 and 132 of the USB interface adaptor 120 and the FIFO interface adaptor 130 may have other numbers and other types of pins according to the system requirement.

In some embodiments, when the USB interface adaptor 120 pushes the data recorded in the columns of the data package into the FIFO storage device 126, the USB interface adaptor 120 can transmit the non-empty signal $SIG_{NEMP}$ to the FIFO interface adaptor 130 through the non-empty pin 1242. When the FIFO interface adaptor 130 receives the non-empty signal $SIG_{NEMP}$, the FIFO interface adaptor 130 can transmit the pop signal $SIG_{POP}$ to the USB interface adaptor 120 through the pop pin 1324 of the port 132, and can receive the data stored in the FIFO storage device 126 though the data pin 1326. In the present embodiment, since the column in the data package that is pushed into the FIFO storage device 126 first is the instruction column, the FIFO interface adaptor 130 can identify the instruction issued by the host 110 according to the first data transmitted from the FIFO storage device 126.

In FIG. 1, the FIFO interface adaptor 130 can further include a finite state machine (FSM) 138. When the FSM 138 is in an idle state, the FSM 138 can monitor the non-empty pin 1322 and see if the non-empty pin 1322 receives the non-empty signal $SIG_{NEMP}$ or not. Once the non-empty signal $SIG_{NEMP}$ is received, the FSM 138 can enter a corresponding state to perform a corresponding operation, such a write operation or a read operation, according to the identified instruction. Also, after the operation is completed, the FSM 138 can return to the idle state and keep monitoring the non-empty pin 1322. However, the present invention is not limited by using FSM 138 to perform the operations of the FIFO interface adaptor 130. In some other embodiments, the FIFO interface adaptor 130 can adopt other types of processors or controllers to perform the required operations.

When the FIFO interface converter 130 identifies that the instruction transmitted from the host 110 is a write instruction, the FIFO interface adaptor 130 can retrieve the data stored in the FIFO storage device 126 through the data pins 1326 of the port 132 to obtain the write address, the write data and the length of the write data. When the FIFO interface adaptor 130 obtain the write address and the write data, the FIFO interface adaptor 130 can transmit the write data to a functional circuit corresponding to the write address through the bus bridge circuit 150. Consequently, the host 110 would be able to perform write operations and read operations to the functional circuits 1401 to 140N on the FPGA board FB.

In some embodiments, the host 110 can write a plurality of pieces of data at once, that is, the length of the write data can be greater than 1. In this case, the FIFO interface adaptor 130 can have the bus bridge circuit 150 enter a burst write mode according to the length of the write data so that the following pieces of data can be written to the corresponding functional circuit. However, in some embodiments, if the bus used by the FPGA board FB does not support the function of burst write, then the length of write data can be constantly set to 1.

Furthermore, in some embodiments, the number of bits transmitted in parallel at the same time by the FIFO storage device 126 can be equal to the number of bits of each piece of write data. In this case, the FIFO storage device 126 can pop one piece of write data at a time; therefore, the FIFO interface adaptor 130 can transmit this piece of write data to the bus bridge circuit 150 directly. However, in some embodiments, the number of bits transmitted in parallel at the same time by the FIFO storage device 126 can be smaller than to the number of bits of each piece of write data. In this case, the FIFO interface adaptor 130 can retrieve data from the FIFO storage device 126 in a number of times and combine a plurality of pieces of data retrieved from the FIFO storage device 126 into one piece of write data. Then, the FIFO interface adaptor 130 can transmit the completed piece of write data to the corresponding functional circuit through the bus bridge circuit 150.

For example, if the bit width of the FIFO storage device 126 is 8 bits, then the port 124 should include 8 data pins so the FIFO storage device 126 can transmit 8 bits of data in parallel at same time. In this case, if each piece of write data includes 32 bits of data, then the FIFO interface adaptor 130 can receive four pieces of data from the FIFO storage device 126 in four times, and combine the four pieces of data into one complete piece of write data. The complete piece of write data is, then, transmitted to the bus bridge circuit 150 for the following transmission. Similarly, the number of bits of the write address may be different from the bit width of the FIFO storage device 126, and the FIFO interface adaptor 130 can retrieve the data from the FIFO storage device 126 in a number of times to obtain the complete write address.

In addition, when the FIFO interface adaptor 130 identifies that the instruction issued by the host 110 is a read instruction, the FIFO interface adaptor 130 can retrieve the data stored in the FIFO storage device 126 through the port 132 to obtain the read address and the length of the read data. Afterward, the FIFO interface adaptor 130 can receive at least one piece of read data from a functional circuit corresponding to the read address through the bus bridge circuit 150 and push the at least one piece of read data to the FIFO storage device 126 through the third port 132. Consequently, the host 110 would be able to perform the read operations of the functional circuits on the FPGA board FB.

In some embodiments, the host 110 can read a plurality of pieces of data at once, that is, the length of the read data can be greater than 1. In this case, the FIFO interface adaptor 130 can have the bus bridge circuit 150 enter a burst read mode according to the length of the read data so that the following pieces of data can be read from the corresponding functional circuit. However, in some embodiments, if the bus used by the FPGA board FB does not support the function of burst read, then the length of read data can be constantly set to 1.

Furthermore, in some embodiments, the number of bits transmitted in parallel at the same time by the FIFO storage device 126 can be equal to the number of bits of each piece of read data. In this case, the FIFO interface adaptor 130 can push one piece of read data to the FIFO storage device 126 at a time. However, in some embodiments, the number of bits transmitted in parallel at the same time by the FIFO storage device 126 can be smaller than to the number of bits of each piece of read data. In this case, the FIFO interface adaptor 130 can divide a piece of read data into a plurality of pieces of data and push the plurality of pieces of data sequentially to the FIFO storage device 126 through the port 132.

In some embodiments, the host 110 can not only perform read operations and write operations to the functional circuits 1401 to 140N on the FPGA board FB but also perform similar operations to the FIFO interface adaptor 130. For example, the FIFO interface adaptor 130 can include at least one configuration register. For example, in FIG. 1, the FIFO interface adaptor 130 can include configuration registers 1361 to 136M, where M is an integer greater than 1. Each of the configuration registers can be corresponding to one configuration of the FIFO interface adaptor 130. For example, the configuration register 1361 can be corresponding to the transmission rate of the FIFO interface adaptor 130 and the control of the correctness verifications, and the configuration register 1362 can be corresponding to the transmission bit width of FIFO interface adaptor 130. In this case, by writing proper values to the configuration registers 1361 to 136M, the FIFO interface adaptor 130 can be controlled in the desired configuration.

In some embodiments, when the host 110 needs to perform write operations to the configuration registers 1361 to 136M of the FIFO interface adaptor 130, the transmission can still be performed with the same format used by the data package aforementioned. When the FIFO interface adaptor 130 identifies that the instruction transmitted from the host 110 is a configuration write instruction, the FIFO interface adaptor 130 can retrieve data stored in the FIFO storage device 126 through the port 132 to obtain a configuration write address and a piece of configuration write data. Afterward, the FIFO interface adaptor 130 will write the piece of configuration write data to a configuration register corresponding to the configuration write address, thereby changing the configuration of the FIFO interface adaptor 130.

Contrarily, when the FIFO interface adaptor 130 identifies that the instruction transmitted from the host 110 is a configuration read instruction, the FIFO interface adaptor 130 can retrieve data stored in the FIFO storage device 126 through the port 132 to obtain a configuration read address, and can push the data stored in the configuration register corresponding to the configuration read address to the FIFO storage device 126 through the port 132. Consequently, the USB interface adaptor 120 can further transmit the data stored in the configuration registers to the host 110 so the host 110 can be aware of the current configuration of the FIFO interface adaptor 130.

That is, the host 110 can perform the read operations and write operations to the configuration registers 1361 to 136M of the FIFO interface adaptor 130, and, thus, control the configuration of the FIFO interface adaptor 130. In some embodiments, if the FIFO interface adaptor 130 has only one fixed configuration or forbids the host 110 from changing its configuration, then the configuration registers 1361 to 136M and/or the corresponding states in the FSM 138 can be omitted by the FIFO interface adaptor 130.

In summary, the data transmission systems provided by the embodiments of the present invention allow the host and the FPGA board to communicate through the USB port, thereby increasing the transmission rate. In addition, in comparison with the complicate devices and hardware components required by the Ethernet transmission, the transmission systems of the present invention can use the USB interface adaptor and the FIFO interface adaptor that have simpler functions and structures to convert the data formats between different communications protocols. Therefore, the complexity of the transmissions system can also be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data transmission system comprising:
    a host comprising a universal serial bus (USB) port and configured to access data through the USB port according to communications protocols of USB;
    a universal serial bus (USB) interface adaptor comprising:
        a first port coupled to the USB port;
        a second port; and
        a first-in first-out (FIFO) storage device configured to store data received from the first port and the second port;
        wherein the USB interface adaptor is configured to access data through the first port according to the communications protocols of USB, and access data through the second port according to communications protocols of FIFO;
    a first-in first-out (FIFO) interface adaptor comprising:
        a third port coupled to the second port; and
        a fourth port;
        wherein the FIFO interface adaptor is configured to access data through the third port according to the communications protocols of FIFO, and access data through the fourth port according to communications protocols of a specific type of bus;
    a plurality of functional circuits each configured to perform a corresponding function; and
    a bus bridge circuit coupled to the fourth port and the plurality of functional circuits, and configured to transmit data received from the fourth port to a corresponding functional circuit of the plurality of functional circuits and transmit data sent from the corresponding functional circuit to the fourth port
    wherein:
    when the FIFO interface adaptor identifies a write instruction, the FIFO interface adaptor is further configured to retrieve data stored in the FIFO storage device through the third port to obtain a length of write data; and
    the FIFO interface adaptor is further configured to have the bus bridge circuit enter a burst write mode according to the length of write data.

2. The data transmission system of claim 1, wherein the host is disposed on a circuit board of a computer system, and the FIFO interface adaptor, the plurality of functional circuits, and the bus bridge circuit are disposed on a field-programmable gate array (FPGA) board.

3. The data transmission system of claim 1, wherein the plurality of functional circuits comprise a memory, a peripheral device, a central processing unit, a graphic processing unit, and/or a digital signal processor.

4. The data transmission system of claim 1, wherein the specific type of bus is a bus defined by advanced microcontroller bus architecture (AMBA) or a bus defined by open core protocol (OCP).

5. The data transmission system of claim 1, wherein the host transmits a data package through the USB port, and the data package comprises:
    an instruction column configured to record an instruction;
    an address column configured to record an address corresponding to the instruction;
    a data column configured to record at least one piece of data corresponding to the instruction; and
    a data length column configured to record a data length of the at least one piece of data.

6. The data transmission system of claim 5, wherein the data package further comprises a check column configured to record a check sum for verifying correctness of data transmission.

7. The data transmission system of claim 1, wherein:
    the USB interface adaptor is further configured to transmit a FIFO non-empty signal to the FIFO interface adaptor through the second port when the FIFO storage device has data stored therein; and
    when the FIFO interface adaptor receives the FIFO non-empty signal, the FIFO interface adaptor is further configured to retrieve data stored in the FIFO storage device through the third port to identify the write instruction.

8. The data transmission system of claim 7, wherein:
    when the FIFO interface adaptor identifies the write instruction, the FIFO interface adaptor is further configured to retrieve data stored in the FIFO storage device through the third port to obtain a write address and at least one piece of write data; and
    the FIFO interface adaptor is further configured to transmit the at least one piece of write data to a functional circuit corresponding to the write data through the bus bridge circuit.

9. The data transmission system of claim 8, wherein:
    number of bits transmitted in parallel at the same time by the FIFO storage device is smaller than number of bits of each piece of write data, and the FIFO interface adaptor is further configured to combine a plurality of pieces of data retrieved from the FIFO storage device in a number of times into a piece of write data and transmit the piece of write data to the functional circuit corresponding to the write address through the bus bridge circuit.

10. The data transmission system of claim 7, wherein:
    when the FIFO interface adaptor identifies a read instruction, the FIFO interface adaptor is further configured to retrieve data stored in the FIFO storage device through the third port to obtain a read address;
    the FIFO interface adaptor is further configured to receive at least one piece of read data from a functional circuit corresponding to the read address through the bus bridge circuit; and
    the FIFO interface adaptor is further configured to push the at least one piece of read data to the FIFO storage device through the third port.

11. The data transmission system of claim 10, wherein:
when the FIFO interface adaptor identifies the read instruction, the FIFO interface adaptor is further configured to retrieve data stored in the FIFO storage device through the third port to obtain a length of read data; and
the FIFO interface adaptor is further configured to have the bus bridge circuit enter a burst read mode according to the length of read data.

12. The data transmission system of claim 10, wherein:
number of bits transmitted in parallel at the same time by the FIFO storage device is smaller than number of bits of each piece of read data, and the FIFO interface adaptor is further configured to divide a piece of read data into a plurality of pieces of data and push the plurality of pieces of data sequentially to the FIFO storage device through the third port.

13. The data transmission system of claim 7, wherein:
the FIFO interface adaptor further comprises at least one configuration register;
when the FIFO interface adaptor identifies a configuration write instruction, the FIFO interface adaptor is further configured to retrieve data stored in the FIFO storage device through the third port to obtain a configuration write address and a piece of configuration write data; and
the FIFO interface adaptor is further configured to write the piece of configuration write data to a configuration register corresponding to the configuration write address.

14. The data transmission system of claim 7, wherein:
the FIFO interface adaptor further comprises at least one configuration register;
when the FIFO interface adaptor identifies a configuration read instruction, the FIFO interface adaptor is further configured to retrieve data stored in the FIFO storage device through the third port to obtain a configuration read address; and
the FIFO interface adaptor is further configured to push data stored in a configuration register corresponding to the configuration read address to the FIFO storage device through the third port.

15. The data transmission system of claim 7, wherein:
the FIFO interface adaptor further comprises a finite state machine (FSM) configured to enter a corresponding state according to the write instruction.

* * * * *